United States Patent [19]

Shimoji

[11] Patent Number: 5,342,803
[45] Date of Patent: Aug. 30, 1994

[54] METHOD FOR ISOLATING CIRCUIT ELEMENTS FOR SEMICONDUCTOR DEVICE

[75] Inventor: Noriyuki Shimoji, Kyoto, Japan
[73] Assignee: Rohm, Co., Ltd., Kyoto, Japan
[21] Appl. No.: 14,826
[22] Filed: Feb. 3, 1993
[51] Int. Cl.$^5$ ............................................ H01L 21/76
[52] U.S. Cl. ................................... 437/70; 437/69; 437/26; 437/982; 437/947
[58] Field of Search ............. 437/70, 26, 69, 982, 437/947

[56] References Cited

FOREIGN PATENT DOCUMENTS

| | | | |
|---|---|---|---|
| 0111097 | 6/1984 | European Pat. Off. | 437/70 |
| 0114685 | 10/1978 | Japan | 437/70 |
| 0129591 | 11/1978 | Japan | 437/70 |
| 0158443 | 12/1981 | Japan | 437/70 |
| 0130418 | 8/1982 | Japan | 437/70 |
| 0000937 | 1/1984 | Japan | 437/70 |

Primary Examiner—Tom Thomas
Assistant Examiner—Trung Dang
Attorney, Agent, or Firm—Nikaido, Marmelstein, Murray & Oram

[57] ABSTRACT

Provided is a method for isolating circuit elements for effectively isolating devices on a semiconductor substrate from each other with use of a narrow insulating film. With such a method there is no likelihood of causing crystal defect in the semiconductor substrate or of deterioration in function of the channel stop of a channel stop region upon formation of the insulating film. The method for isolating circuit elements of the present invention includes steps of forming an insulating film over a semiconductor substrate, selectively removing the insulating film on a region to be an active region by etching to form a field insulator film, and implanting through the field insulator film ion of an impurity for preventing inversion of the conductivity type of the substrate into a region just under the field insulator film and adjacent to the surface of the substrate so as to form a channel stop region.

6 Claims, 7 Drawing Sheets

METHOD FOR ISOLATING CIRCUIT ELEMENTS FOR SEMICONDUCTOR DEVICE

FIELD OF THE INVENTION

The present invention relates to a method for isolating circuit elements for semiconductor device and, more particularly, to a method for isolating circuit elements for electrically insulating devices on a semiconductor substrate from each other, in which devices constitute an integrated circuit.

BACKGROUND OF THE INVENTION

Device isolation technology is being employed for electrically isolating devices from each other on a semiconductor substrate in forming an integrated circuit. Representative examples of such device isolation technology include a LOCOS method and the so-called "BOX (Buried Oxide Isolation) method" wherein a recess is formed in the surface of a semiconductor substrate, then refilled with an insulator. The process of the LOCOS method is illustrated in FIGS. 8(a) to 8(d).

Figure 8A:
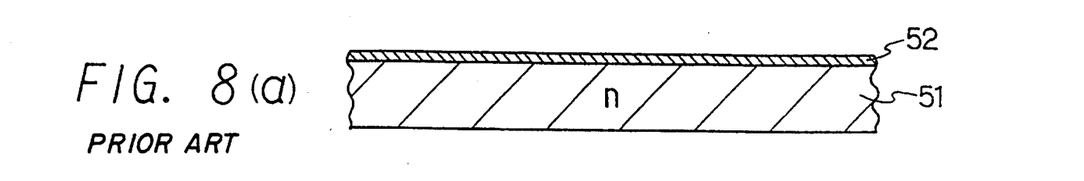
FIGS. 8(a)-8(d) are schematic sectional views for illustrating an example of a conventional device insulator process.

First, as shown in FIG. 8(a), a silicon nitride film 52, for example, is formed on a semiconductor substrate 51 (for example, made of n type silicon) by CVD method.

Figure 8B:
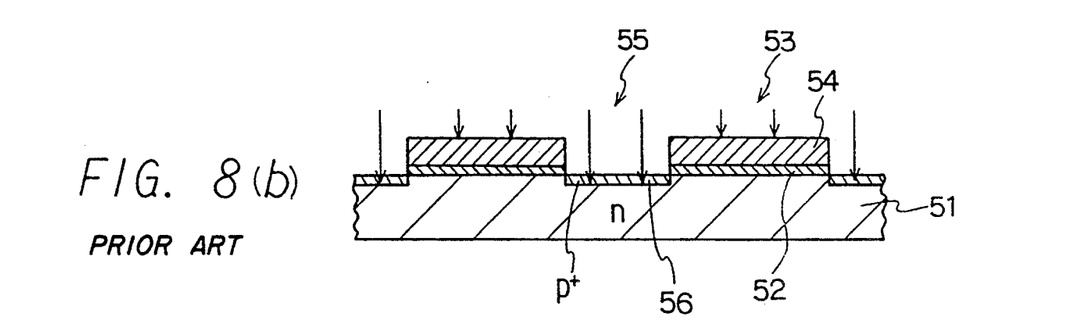

Next, as shown in FIG. 9(b), the silicon nitride film 52 except for that on an intended active region 53, is removed by etching using a resist film 54 as a mask, followed by ion implantation of, for example, boron without removing the resist film 54. Note that an arrow indicates a track of an ion's in the drawings. Since the resist film 54 prevents boron ion from reaching the silicon substrate 51, only a desired device isolation region 55 of the substrate 51 is implanted with boron ion. This ion-implanted region is a $p^+$-region which will serve as a channel stop region 56 for preventing a channel from forming in the device isolation region 55 due to occurrence of an inversion of the conductivity type at the surface of the silicon substrate 51 in that region.

Figure 8C:
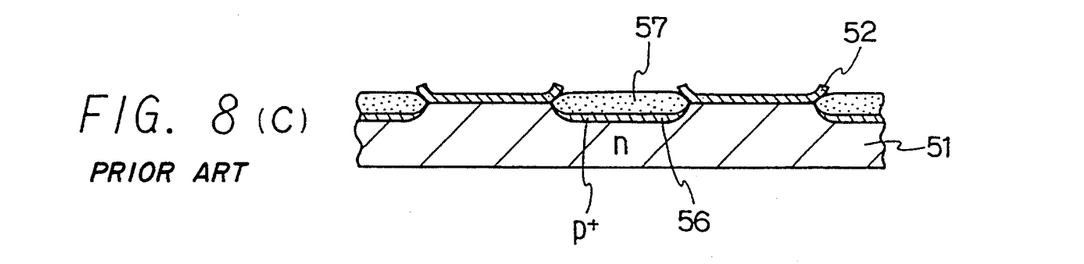

In turn, as shown in FIG. 8(c), after removal of the resist film 54, a field oxide film 57 of $SiO_2$ is formed on the region uncovered with the silicon nitride film 52 by thermal oxidation method.

Figure 8D:
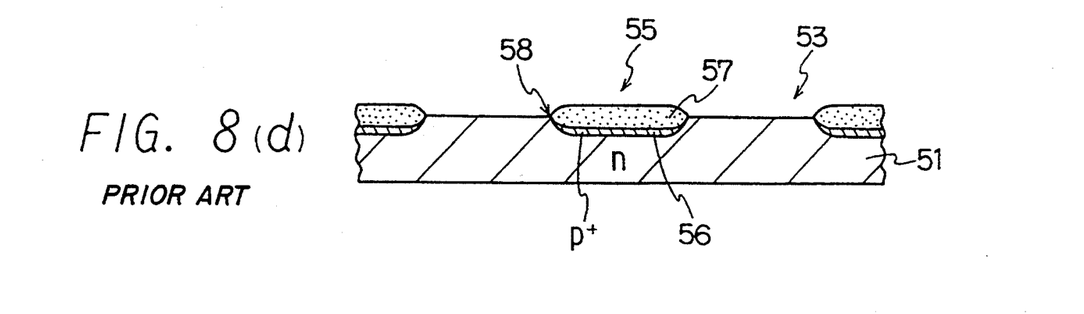

Further, as shown in FIG. 8(d), the silicon nitride film 52 is removed by hot phosphoric acid to define on the silicon substrate 51 a device isolation region 55 with the field oxide film 57 and an active region 53 without the field oxide film 57. In addition, the channel stop region 56 is formed just under the field oxide film 57.

With the above LOCOS method, a protrusion 58 called a bird's beak is formed at opposite ends of the field oxide film 57. Forming the protrusion 58 in the active region 53 causes to narrow the active region 53. This results in such a problem that integration of devices cannot be highly increased.

Further, upon formation of the field oxide film 57 by thermal oxidation method, the impurity forming in the channel stop region 56 is likely to be absorbed by the field oxide film 57 due to segregation. Hence, the impurity concentration of the channel stop region 56 might be undesirably lowered to deteriorate a function of the channel stopper. This causes such a problem as to increase leakage current at channel stopper.

In addition, also upon formation of the field oxide film 57, the opposite ends of the silicon nitride film 52 are raised by the field oxide film 57 (refer to FIG. 8(c)), with the result that a strain is generated due to a stress in the silicon substrate 51 deposited with the silicon nitride film 52. Thus, crystal defect due to such strain tends to be formed.

SUMMARY OF THE INVENTION

The present invention has been attained to solve the foregoing problems. Thus, it is an object of the present invention to provide a method for isolating circuit elements by which devices on a semiconductor substrate can be effectively isolated from each other with a narrow insulating film and without causing crystal defect, whereby the integration density of devices can be remarkably increased.

According to the present invention, there is provided a method for isolating semiconductor devices which comprises step of:

(a) forming an insulating film on a semiconductor substrate;

(b) selectively removing the insulating film located on a region of the semiconductor substrate to be an active region by etching to form a device isolation region having a field insulator film which is retained after the etching; and (c) implanting ion of an impurity into the semiconductor substrate through the field insulator film to form a channel stop region, the impurity serving to prevent inversion of a conductive type of the semiconductor substrate in the device insulator region.

In the present invention, preferably the etching for selectively removing the insulating film is carried out employing an isotropic etching technique with use of a resist film as a mask.

Alternatively, the etching can be carried out employing an anisotropic etching technique with use of a resist film having a tapered opening as a mask.

Further, the etching can be accomplished by performing isotropic etching and anisotropic etching in this order with use of a resist film as a mask.

Yet, an edge portion of the field insulator film which results from the etching is preferably smoothed by a heat treatment.

Moreover, it is preferable to implant ion of the impurity into the device insulator region only, with the active region covered with a resist film.

With the present invention, since the field insulator film is formed by selectively removing the insulating film on the region intended to be an active region by etching, unlike the LOCOS technique, formation of the field insulator film will not cause crystal defect in the semiconductor substrate. Further, since the channel stop region is formed by implanting ion of the impurity through the field insulator film, the channel stop function of the channel stop region will not be deteriorated due to the influence of field insulator film formation. Hence, device insulator can be effectively accomplished with even a narrow field insulator film. In addition, if the etching for selectively removing the insulating film or such a treatment like a thermal treatment which is performed after etching is contrived, a sharp edge of the field insulator film can be smoothed or made gentle. Hence, there can be prevented a break in a metal interconnection layer to be formed later due to a sharp step which would result from the sharp edge of the field insulator film.

BRIEF EXPLANATION OF THE DRAWINGS

FIGS. 7(a)-7(j) are schematic sectional views for illustrating an example of CMOS process adopting a method for isolating circuit elements of the present invention.

DETAILED DESCRIPTION

Now, a method for isolating circuit elements according to the present invention will be described in detail with reference to the drawings.

Figure 1A:
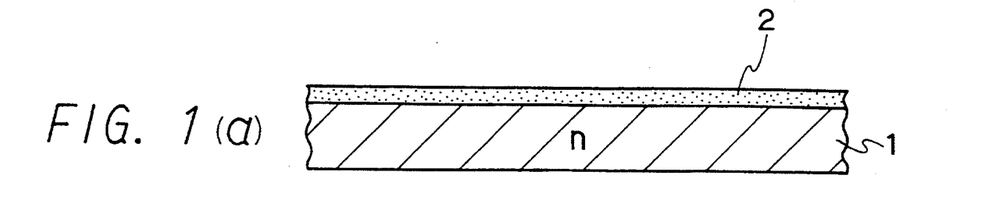
FIGS. 1(a)-1(d) are schematic sectional views for illustrating a process of a method for isolating circuit elements embodying the present invention.

In an embodiment of a method for isolating circuit elements according to the present invention, first, an insulator film is formed on a semiconductor substrate made of for example n type silicon. Specifically, as shown in FIG. 1(a), a film oxide 2 of for example $SiO_2$ is formed to about 3000 to about 6000 Å thick on a silicon substrate 1 by a thermal oxidation method or CVD method. The semiconductor substrate as used in this embodiment can be made of germanium (Ge), silicon carbide (SIC), or gallium arsenide (GaAs) as well as of silicon. On the other hand, the insulating film can be formed of a silicon nitride film or an oxynitride film as well as of a silicon oxide film.

Figure 1B:
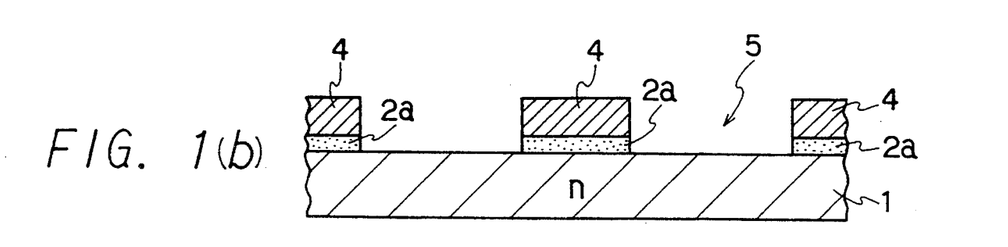

Next, the insulator film on a region intended to be a device insulator region is covered with a resist film, and then the insulating film located on a region to be an active region is removed by etching. Specifically, as shown in FIG. 1(b), the film oxide 2 is applied a resist film 4 to, followed by removing the resist film 4 located on an desired active region 5 by exposure and development. The film oxide 2 located on the desired active region 5 is selectively removed by etching to expose the silicon substrate 1 in that region. As a result, a field oxide film 2a is defined with the resist film 4 retained thereon.

Figure 1C:
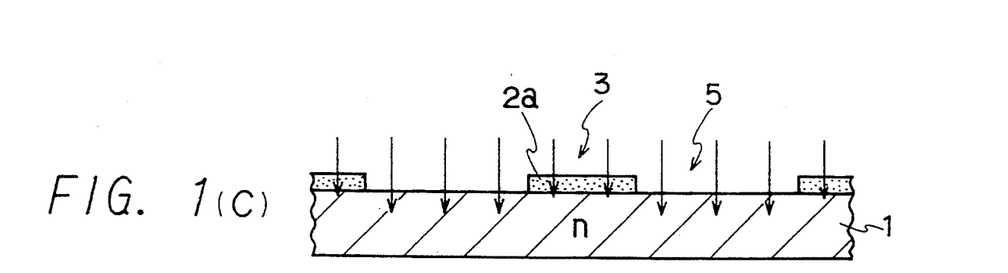

In turn, ion of an impurity is implanted into a region just under the field oxide film 2a defining the desired device insulator region. Specifically, as shown in FIG. 1(c), boron ion is implanted to the whole of the substrate surface for example at an acceleration energy of 150 to 200 keV and a dose of 5E12 to 5E13 $cm^{-2}$. In this case, since adjustment of the acceleration energy enables to adjust the depth of ion implantation, the acceleration energy should be adjusted so that boron ion can just reach the silicon substrate surface through the field oxide film 2a. As a result, boron ion is implanted in a region adjacent to the surface of the silicon substrate 1 in a device insulator region 3 covered with the field oxide film 2a thereby forming a $p^+$-region just under the field oxide film 2a. On the other hand, in the active region 5 boron ion is implanted into the silicon substrate 1 relatively deeply because of the absence of film oxide in this region, to form a $p^+$-region at a relatively large depth of the substrate 1.

Figure 1D:
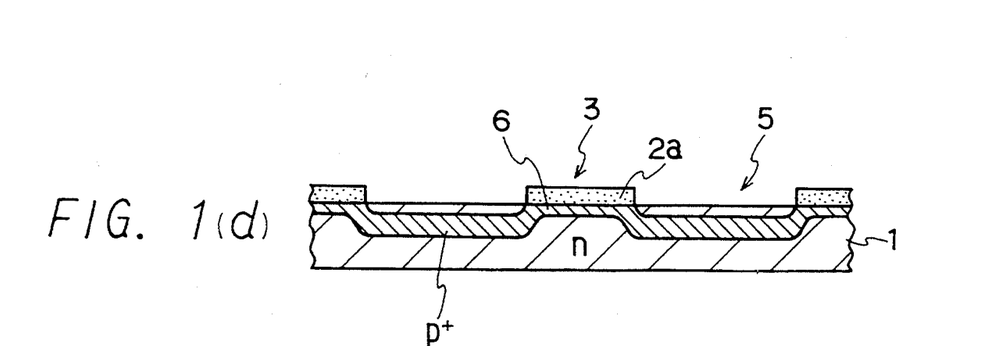

The semiconductor substrate thus treated has the device insulator region covered with the field oxide film just under which a channel stop region is formed and the active region having an impurity-doped layer formed relatively deeply. Specifically, as shown in FIG. 1(d), on the device insulator region 3 of the silicon substrate 1, is formed the field oxide film 2a, having a thickness of 3000 to 6000 Å, while on the other hand in the active region 5 the silicon substrate 1 is exposed. Further, just under the field oxide film 2a, a channel stop region composed of a $p^+$-layer having a thickness of 1000 to 2000 Å is formed. The active region 5 also has a $p^+$-layer distributed at a depth of 3000 to 6000 Å so that a p-type well is formed.

In the above embodiment the insulating film on the active region is removed by a common etching technique. However, the common etching forms a sharp step at edges of the etched insulating film. This clear-cut step is likely to cause an interconnection line of aluminum, polysilicon or the like to thin down at the edge of the step or to be broken on that account. Accordingly, it is preferable to make the clear-cut step smooth with use of the following, for example, four kinds of techniques as shown in FIGS. 2 to 5.

Figure 2:
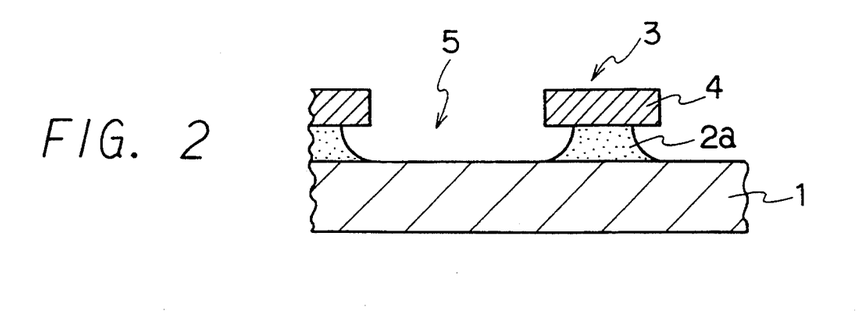
FIG. 2 is a schematic sectional view showing a field oxide film isotropically etched in the etching step of the method for isolating circuit elements as illustrated in FIG. 1.

FIG. 2 illustrates in section an insulating film which is isotropically etched after forming a resist film thereon. With this technique the insulating film is etched so that the etched wall would have an arc like shape in section. In addition, an active region of a semiconductor substrate is less damaged than with an etching technique utilizing ion bombardment. For example, this isotropic etching includes the steps of covering a film oxide 2 on a device insulator region 3 of a silicon substrate 1 with a resist film 4, and selectively removing the film oxide 2 on an active, region 5 by a wet etching technique using hydrofluoric acid or a chemical dry etching technique (CDE).

Figure 3:
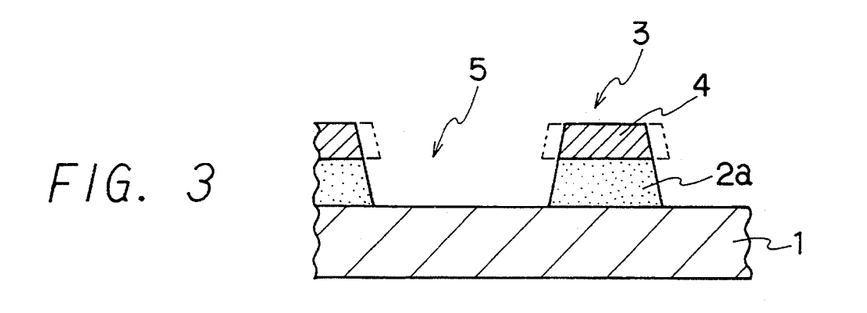
FIG. 3 is a schematic sectional view showing a field oxide film anisotropically etched to have tapered edges in the etching step of the method for isolating circuit elements as illustrated in FIG. 1.

FIG. 3 illustrates in section an insulating film formed with a resist film having tapered ends and anisotropically etched by a dry etching technique or a like technique. The use of the tapered resist film as a mask for etching allows the insulating film to be etched and tapered at the same angle as that of the tapered wall of the resist film. Thus, the resulting edges of the insulating film are made obtuse, thereby making the step associated therewith smooth. This contributes to reduce the possibility of a break of an interconnection line or a like advantage. This embodiment also offers an advantage that a device insulator region can be narrowed. Specifically, this etching technique includes the steps for forming a tapered resist film 4 by overexposure or the like, and etching a film oxide 2 by a dry etching technique such as reactive ion etching RIE. In this case, the resist film 4 is also etched during the etching of the film oxide 2. The original shape of the resist film 4 is indicated by a phantom line.

Figure 4:
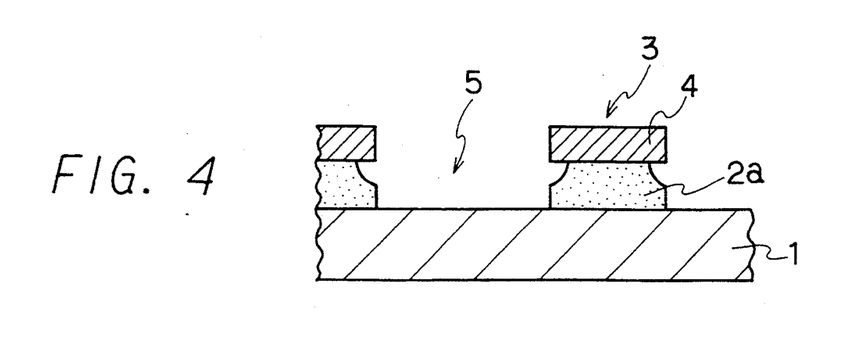
FIG. 4 is a schematic sectional view showing a field oxide film isotropically etched, then anisotropically etched in the etching step of the method for isolating circuit elements as illustrated in FIG. 1.

FIG. 4 illustrates another technique for etching an insulating film. According to this etching technique, about a half of the insulating film in terms of its thickness is etched first by isotropic etching, and then the remaining half thereof is etched by anisotropic etching to expose the surface of a semiconductor substrate. With this etching technique, the upper portion of the etched wall of the insulating film has an arc like shape in section thereby making the step associated therewith gentle. Specifically, this etching technique includes the steps of covering a film oxide 2 in a device insulator region 3 of a silicon substrate 1 with a resist film 4, etching the film oxide 2 down to about a half of its film thickness by a wet etching technique using hydrofluoric acid or a CDE technique, and completely removing the film oxide 2 remaining on an active region 5 free of the resist film 4 by RIE.

Figure 5:
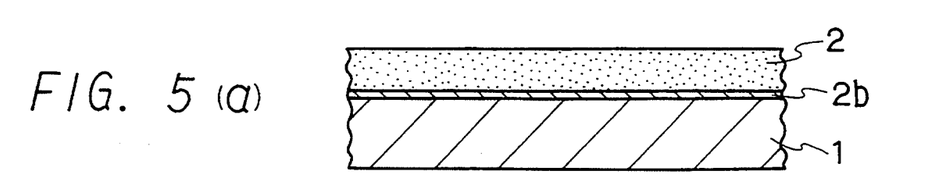
FIGS. 5(a)-5(c) are schematic sectional views for illustrating a technique of making the edges of an etched field oxide film smooth using a heat treatment after the etching step of the method for isolating circuit elements as illustrated in FIG. 1.

FIG. 5 illustrates yet another technique for smoothing the edges of an insulating film. According to this embodiment the insulating film is anisotropically etched, then heated to chamfer or make the edges of the insulating film smooth.

Specifically, firstly, as shown in FIG. 5(a), a relatively thin film oxide 2b is formed on a silicon substrate 1 by thermal oxidation or CVD, followed by forming thereon a film oxide 2 composed of a low melting point material such as PSG, BPSG or the like.

Next, as shown in FIG. 5(b), the film oxide 2 on a device insulator region 3 of the silicon substrate 1 is covered with a resist film 4, followed by selectively removing the film oxides 2 and 2b on an active region 3 by RIE to form a field oxide film 2a.

In turn, the field oxide film 2a is made to reflow by a heat treatment at about 800° C. to about 950° C. for about 30 minutes. As a result, the field oxide film 2a is fused a little so that the edges thereof are made smooth. Here, the thin film oxide 2b is provided for preventing the impurity contained in the film oxide 2 from diffusing into the silicon substrate 1 because of the heat treatment. If such diffusion is allowed, the provision of the thin film oxide 2b is unnecessary. Preferably the heat treatment is conducted in a nitrogen gas atmosphere for preventing oxidation of the active region of the silicon substrate.

Figure 6A:
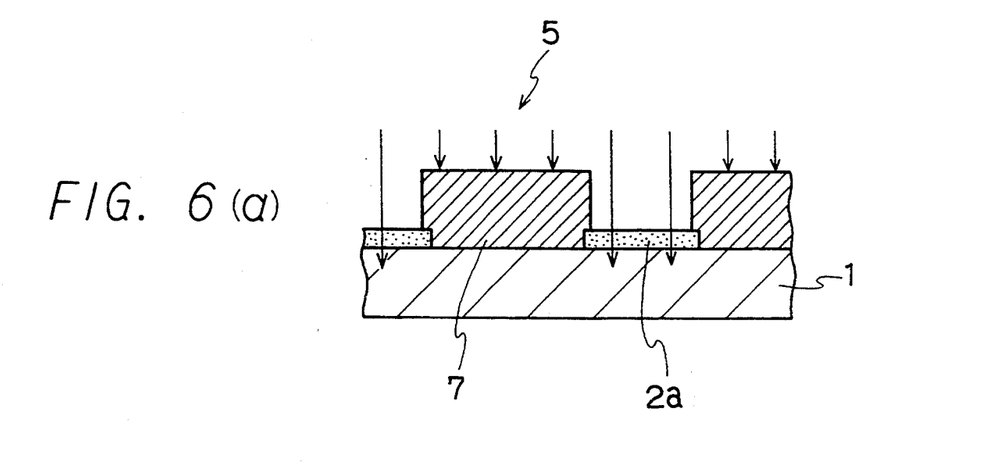
FIGS. 6(a)-6(b) are schematic sectional views for illustrating a procedure of ion implantation with an active region covered with a resist film in the ion implantation step of the method for isolating circuit elements as illustrated in FIG. 1.
Figure 6B:
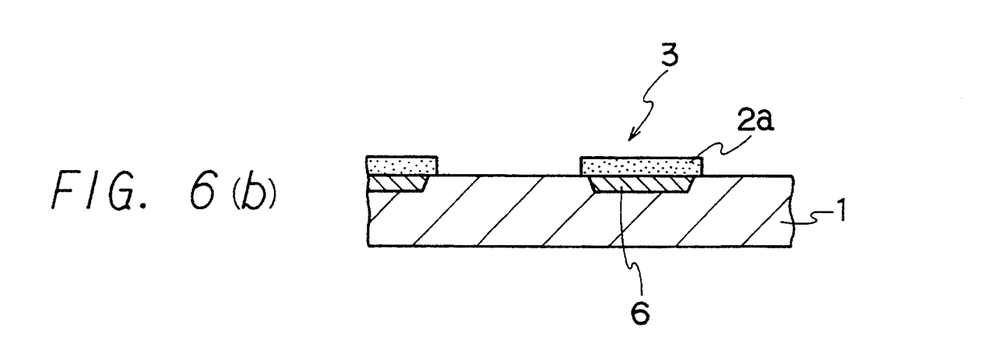

In the embodiment shown in FIGS. 1(a)-(d) ions of the impurity are implanted to the entire substrate surface, so that the impurity-doped layer is formed in the active region relatively deeply from the substrate surface. However, it is possible to conduct ion implantation with the active region covered with a resist film when required. In this case, the impurity-doped layer in the active region can be prevented from forming. Specifically, as shown in FIG. 6(a), the active region 5 covered with a resist film 7, impurity ion is prevented from reaching the silicon substrate 1 in the active region 5 by the resist film 7. Accordingly, the substrate 1 in the device insulator region 3 only is implanted with ion to form the channel stop region 6.

This technique would enable us to prevent too much rise of threshold voltage when the substrate is biased, if it is adopted to, for example, a MOS IC, or to avoid a change in the impurity concentration of a base region or a collector region, if it is adopted to a bipolar IC.

Figure 7A:
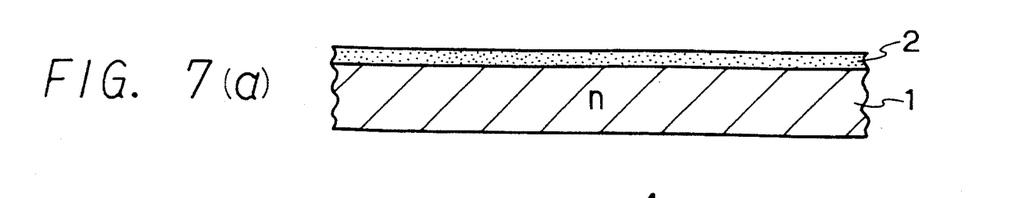

Next, an example of CMOS process for which the method for isolating circuit elements of the present invention was adopted described is.

Firstly, as shown in FIG. 7(a), on a n-type silicon substrate having a cube face of (100) 1 of 2 to 3 Ω.cm resistivity, formed was a film oxide 2 about 4000 Å thick by a thermal oxidation technique.

Figure 7B:
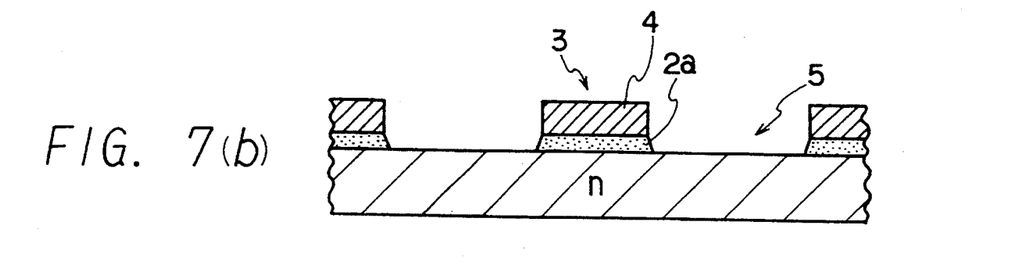

Secondly, as shown in FIG. 7(b), a resist film was formed over the shole of the surface of the film oxide 2 and patterned so that a resist film 4 would be retained on the film oxide 2 in a region to be a device insulator region 3. Subsequently the film oxide 2 in a region to be an active region 5 is selectively removed by etching using hydrofluoric acid with use of the resist film 4 as a mask to define a field oxide film 2a.

Figure 7C:
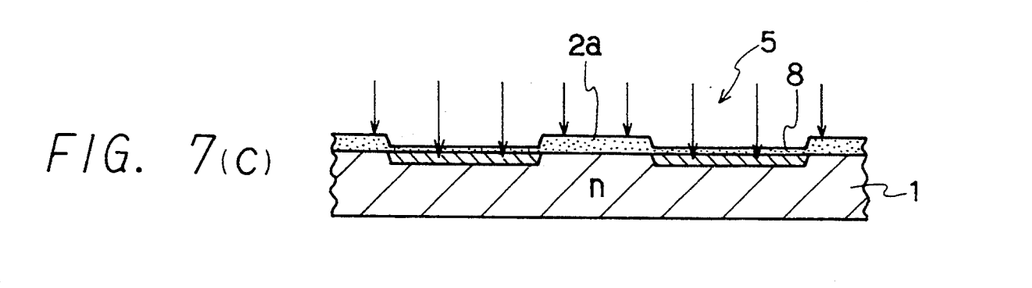

Thirdly, as shown in FIG. 7(c), on the active region 5 of the silicon substrate 1 a gate oxide film 8 about 300 Å thick was formed, followed by implantation of boron ion, for example, at an acceleration energy of about 30 keV and a dose of about 1E12cm$^{-2}$ to adjust the threshold voltage of an intended MOS transistor.

Figure 7D:
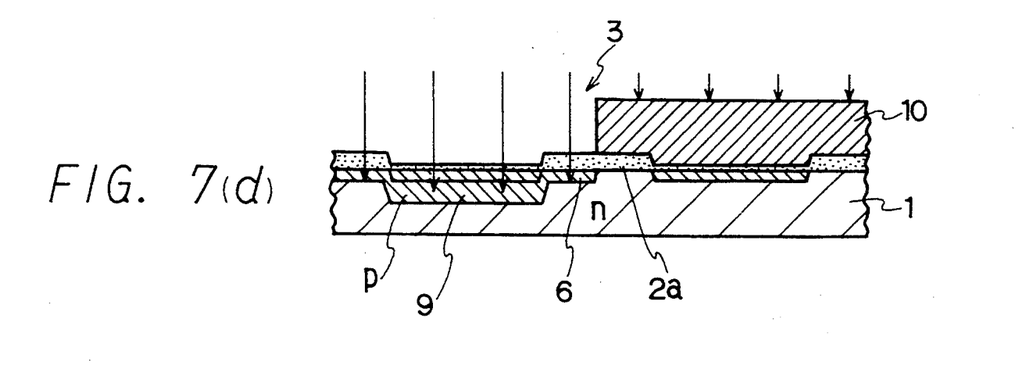

Fourthly, as shown in FIG. 7(d), a region of the silicon substrate 1 which was intended for a p-channel MOS region was covered with a resist film 10, followed by implantation of boron ion with respect to a region intended for a n-channel MOS region so as to form a channel stop region 6 just under the field oxide film 2a in the device insulator region 3 which is in the side of the n-channel MOS region.

Figure 7E:
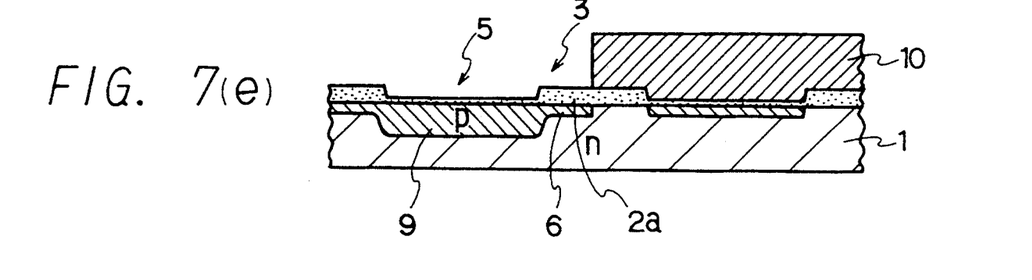

In the n-channel MOS region of the substrate 1 thus treated, as shown in FIG. 7(e), the channel stop region 3 was formed just under the field oxide film 2a in the device insulator region 3, while on the other hand a p-well layer 9 was formed in the active region 5.

Figure 7F:
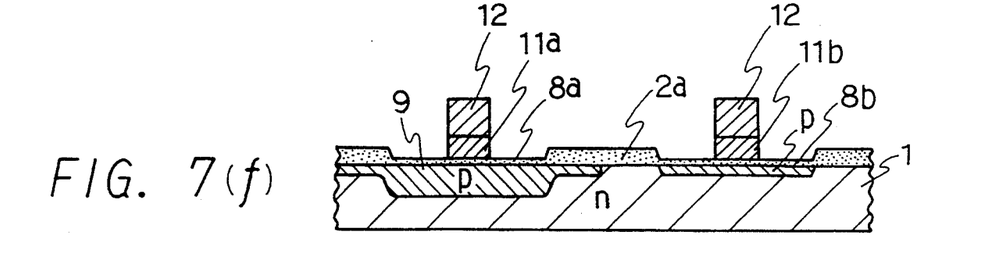

Fifthly, as shown in FIG. 7(f), a polysilicon film was deposited and etched with use of a resist film 12 to form gate electrodes 11a and 11b.

Figure 7G:
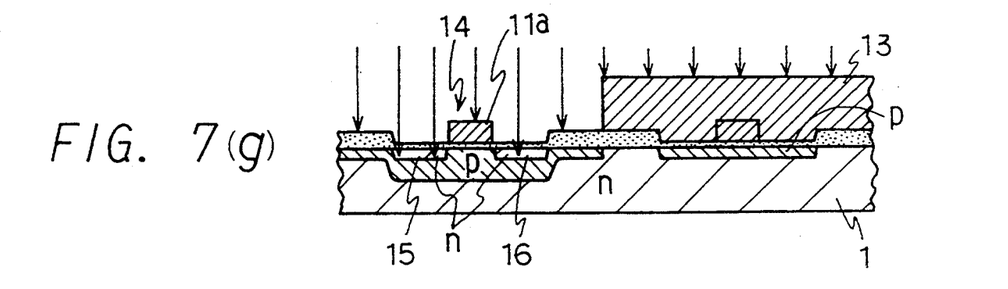

Sixthly, as shown in FIG. 7(g), the p-channel MOS region was again covered with a resist film 13, followed by implantion of arsenic ion at an acceleration energy of about 40 keV and a dose of about 5E15cm$^{-2}$ into the n-channel MOS region to form source/drain regions 15 and 16 of a n-channel MOS transistor 14.

Figure 7H:
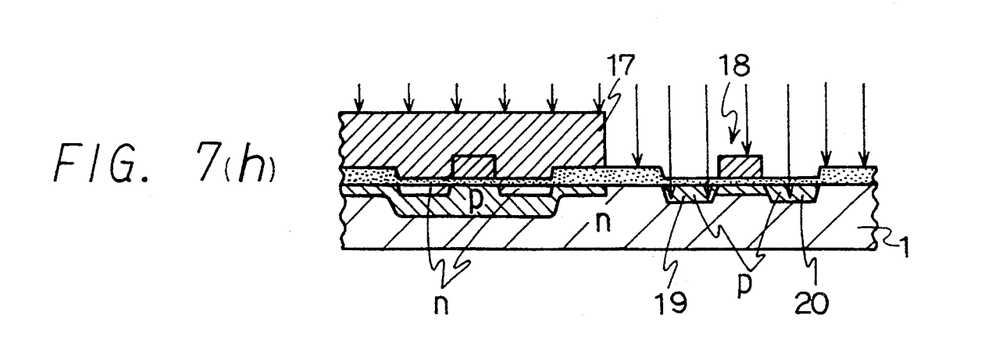

Seventhly, as shown in FIG. 7(h), the n-channel MOS region was covered with a resist film 17, followed by implantation of BF$_2$ ion at an acceleration energy of about 40 keV and a dose of about 5E15cm$^{-2}$ with respect to the p-channel MOS region to form source/-drain regions 19 and 20 of a p-channel MOS transistor 18.

Figure 7I:
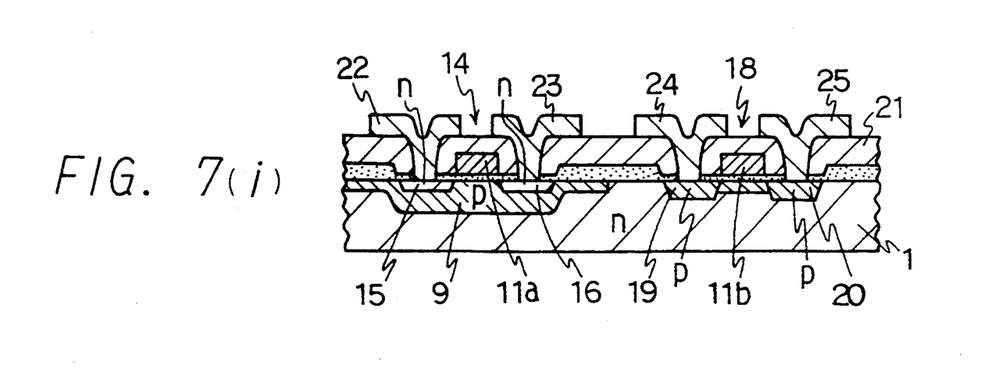

Eightly, as shown in FIG. 7(i), an interlayer insulating film 21 such as of PSG or BPSG was formed on the whole of the surface of the resulting substrate, then formed with an opening by etching, followed by providing with a metal film so that a source and a drain electrode of each transistor are formed by sputtering or a like technique. Thus, a CMOS transistor comprising the n-channel MOS transistor 14 and p-channel MOS transistor 18 was completed.

As has been described, according to the present invention an insulating film is formed on a semiconductor substrate and patterned to define a field insulator film, followed by ion implantation into a region just under the field insulator film to form a channel stop region. Hence, there is no deterioration in the channel stop function of the channel stop region due to influences of field insulator film formation. Accordingly, devices on a semiconductor substrate can be effectively isolated from each other with a narrow field insulator film. In addition, there is no need to form a thick film oxide by subjecting the semiconductor substrate to local oxidation; hence, there is no likelihood of causing crystal defect in the substrate.

Though several embodiments of the present invention described above, it is to be understood that the present invention is not limited to the above-mentioned embodiments, and various changes and modifications may be made in the invention without departing from the spirit and scope thereof.

What is claimed is:

1. A method for isolating semiconductor devices which comprises steps of:
   (a) forming an insulating film on a semiconductor substrate;
   (b) selectively removing the insulating film located on a region of the semiconductor substrate to be an active region by etching to form a device insulator region having a field insulator film which is retained after the etching, wherein said etching is carried out employing an anisotropic etching technique with use of a resist film, having tapered openings, as a mask; and
   (c) implanting ions of an impurity into the semiconductor substrate through the field insulator film to form a channel stop region, the impurity serving to prevent inversion of a conductive type of the semiconductor substrate in the device insulator region.

2. The method as set forth in claim 1, wherein said etching for selectively removing said insulating film is carried out also employing an isotropic etching technique with use of a resist film as a mask.

3. The method as set forth in claim 1, wherein said etching is accomplished by performing isotropic etching and said anisotropic etching in this order with use of a resist film as a mask.

4. The method as set forth in claim 1, wherein an edge portion of said field insulator film which results from said etching is smoothed by a heat treatment.

5. The method as set forth in claim 1, wherein said device insulator region only is implanted with ions of said impurity by covering said active region with a resist film.

6. A method for isolating semiconductor devices which comprises steps of:
   (a) forming a first insulating film on a semiconductor substrate;
   (b) forming a second insulating film on said first insulating film;
   (c) selectively removing the insulating films located on a region of the semiconductor substrate to be an active region by etching to form a device insulator region having a field insulator film which is retained after the etching;
   (d) smoothing an edge portion of said field insulator film, which results from said etching, by a heat treatment; and
   (e) implanting ions of an impurity into the semiconductor substrate through the field insulator film to form a channel stop region, the impurity serving to prevent inversion of a conductive type of the semiconductor substrate in the device insulator region.

* * * * *